US00RE50046E

(19) United States
(12) Reissued Patent
Kim

(10) Patent Number: US RE50,046 E
(45) Date of Reissued Patent: *Jul. 16, 2024

(54) ORGANIC LIGHT EMITTING DISPLAY DEVICE AND MANUFACTURING METHOD THEREOF

(71) Applicant: SAMSUNG DISPLAY CO., LTD., Yongin-si (KR)

(72) Inventor: Sung-Hoon Kim, Yongin-si (KR)

(73) Assignee: Samsung Display Co., Ltd., Yongin-si (KR)

( * ) Notice: This patent is subject to a terminal disclaimer.

(21) Appl. No.: 17/510,352

(22) Filed: Oct. 25, 2021

Related U.S. Patent Documents

Reissue of:
(64) Patent No.: 9,466,648
Issued: Oct. 11, 2016
Appl. No.: 14/338,697
Filed: Jul. 23, 2014

U.S. Applications:
(63) Continuation of application No. 16/155,970, filed on Oct. 10, 2018, now Pat. No. Re. 48,793, which is an application for the reissue of Pat. No. 9,466,648.

(30) Foreign Application Priority Data

Jan. 28, 2014 (KR) ..... 10-2014-0010048

(51) Int. Cl.
*H01L 27/32* (2006.01)
*H01L 51/52* (2006.01)
(Continued)

(52) U.S. Cl.
CPC ..... *H10K 50/8428* (2023.02); *H10K 50/86* (2023.02); *H10K 59/1201* (2023.02); *H10K 59/122* (2023.02); *H10K 59/1315* (2023.02)

(58) Field of Classification Search
CPC ..... H01L 27/3246; H01L 27/3279; H01L 51/525; H01L 2227/323; H01L 27/3276;
(Continued)

(56) References Cited

U.S. PATENT DOCUMENTS 7,456,811 B2 11/2008 Kwak
7,663,655 B2 2/2010 Kitazawa
(Continued)

FOREIGN PATENT DOCUMENTS

KR 10-2005-0081540 A 8/2005
KR 10-2006-0049436 A 5/2006
(Continued)

*Primary Examiner* — Tuan H Nguyen
(74) *Attorney, Agent, or Firm* — Lewis Roca Rothgerber Christie LLP

(57) ABSTRACT

An organic light emitting diode display may include a substrate, a pixel defining layer on the substrate, being configured to define a pixel area, a pixel electrode on the pixel area, a light emitting layer on the pixel electrode, a common electrode on the light emitting layer, and an auxiliary wire spaced apart from the pixel electrode and disposed on the same layer as the pixel electrode. The pixel defining layer may include a pixel defining part configured to define a pixel area and a spacer protruding from the pixel defining part. The auxiliary wire may not overlap the spacer.

44 Claims, 9 Drawing Sheets

(51) Int. Cl.

| | |
|---|---|
| ***H10K 50/842*** | (2023.01) |
| ***H10K 50/86*** | (2023.01) |
| *H10K 59/12* | (2023.01) |
| *H10K 59/122* | (2023.01) |
| *H10K 59/131* | (2023.01) |

(58) Field of Classification Search
CPC ..... H01L 27/3272; H01L 27/3258; H01L 51/0023
See application file for complete search history.

(56) References Cited

U.S. PATENT DOCUMENTS

| | | | | |
|---|---|---|---|---|
| 8,350,468 | B2 | 1/2013 | Ko et al. | |
| 9,076,745 | B2 | 7/2015 | Choi et al. | |
| 9,252,193 | B2 | 2/2016 | Kim et al. | |
| RE48,793 | E * | 10/2021 | Kim | H10K 59/1315 |
| 2003/0197466 | A1* | 10/2003 | Yamazaki et al. | 313/504 |
| 2006/0158095 | A1* | 7/2006 | Imamura | 313/500 |
| 2007/0194322 | A1 | 8/2007 | Sung et al. | |
| 2009/0033598 | A1 | 2/2009 | Suh | |
| 2010/0171107 | A1* | 7/2010 | Jung | H10K 59/122 257/40 |
| 2010/0171419 | A1 | 7/2010 | Kim et al. | |
| 2012/0313123 | A1* | 12/2012 | Kim | H10K 59/122 257/89 |
| 2013/0207085 | A1 | 8/2013 | Im et al. | |

FOREIGN PATENT DOCUMENTS

| | | |
|---|---|---|
| KR | 10-2006-0055052 | 5/2006 |
| KR | 10-0833775 | 5/2008 |
| KR | 10-2010-0003243 A | 1/2010 |
| KR | 10-2010-0081771 | 7/2010 |
| KR | 10-2012-0122534 | 11/2012 |
| KR | 10-2013-0093187 A | 8/2013 |
| KR | 10-2014-0006180 A | 1/2014 |

* cited by examiner

ORGANIC LIGHT EMITTING DISPLAY DEVICE AND MANUFACTURING METHOD THEREOF

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

[Korean Patent Application No, 10-2014-0010048, filed on Jan. 28, 2014, in the Korean Intellectual Property Office, and entitled: "Organic Light Emitting Display Device And Manufacturing Method Thereof," may be incorporated by reference herein in its entirety.] *This application is a continuation reissue of application Ser. No. 16/155,970, filed on Oct. 10, 2018, which is an application for reissue of U.S. Pat. No. 9,466,648, issued on Oct. 11, 2016, and filed as U.S. application Ser. No. 14/338,697 on Jul. 23, 2014, which claims priority to and the benefit of Korean Patent Application No. 10-2014-0010048, filed in the Korean Intellectual Property Office on Jan. 28, 2014, the entire content of all of which is incorporated herein by reference.*

BACKGROUND

1. Field

Embodiments relate to an organic light emitting diode display including a pixel defining layer with a spacer, and a manufacturing method thereof.

2. Description of Related Art

An organic light emitting diode (OLED) display may be an image display device using an organic light emitting diode (OLED). The OLED generally may include a hole injection electrode and an electron injection electrode. In the OLED, a hole injected from the hole injection electrode and an electron injected from the electron injection electrode may be combined with each other in a light emitting layer to form an exciton, and the OLED may emit light by energy generated when the exciton falls from an excited state to a ground state.

The OLED display may be a self-emission display device and may be advantageous over a liquid crystal display (LCD) in that the OLED display does may not require a separate light source, and thus may have a relatively small thickness and light weight. Further, the OLED display may be receiving attention as the next generation display by virtue of characteristics such as low power consumption, high brightness, and short response time.

SUMMARY

According to exemplary embodiments, an OLED display may include a substrate; a pixel defining layer disposed on the substrate and configured to define a pixel area; a pixel electrode in the pixel area; a light emitting layer on the pixel electrode; a common electrode on the light emitting layer; and an auxiliary wire disposed on the same layer with the pixel electrode and spaced apart from the pixel electrode. The pixel defining layer may include a pixel defining part configured to define the pixel area and a spacer protruding from the pixel defining part, and the auxiliary wire may not overlap the spacer.

The auxiliary wire may be an initialization voltage wire.

The pixel electrode and the auxiliary wire may be made of the same material.

The auxiliary wire may include at least one metal layer and at least one transparent conductive oxide layer.

The auxiliary wire may include a metal layer on the substrate and a transparent conductive oxide layer on the metal layer.

The OLED display may further include a sealing member facing the substrate with the pixel defining layer interposed between the sealing member and the substrate, and the spacer of the pixel defining layer may maintain a space between the substrate and the sealing member.

The pixel defining part and the spacer may be made of the same material.

The spacer may have any of the following shapes: a truncated pyramid, a prism, a truncated cone, a cylinder, a hemisphere, and a hemispheroid.

The auxiliary wire may overlap the pixel defining part.

According to exemplary embodiments, a method of manufacturing an OLED display may include steps of: forming a pixel electrode and an auxiliary wire on a substrate; forming a photosensitive material layer on the pixel electrode and the auxiliary wire; forming a pixel defining layer having a pixel area that exposes a part of the pixel electrode by patterning the photosensitive material layer; forming a light emitting layer on the pixel electrode; and forming a common electrode on the light emitting layer. The pixel defining layer may include a pixel defining part configured to define the pixel area and a spacer protruding from the pixel defining part, and the auxiliary wire may not overlap the spacer.

A mask having a light shielding pattern (i.e. a light blocking pattern) may be used in the forming of the pixel defining layer.

A halftone exposure may be performed in the forming of the pixel defining layer.

The method may further include arranging a sealing member to face the substrate with the pixel defining layer interposed between the sealing member and the substrate, and the spacer of the pixel defining layer may maintain a space between the substrate and the sealing member.

The spacer may have any one of the following shapes: a truncated pyramid, a prism, a truncated cone, a cylinder, a hemisphere, and a hemispheroid.

The forming of the pixel defining layer and the auxiliary wire may include forming a conductive material layer including at least one metal layer and at least one transparent conductive oxide layer on the substrate; and patterning the conductive material layer.

The foregoing summary may be illustrative only and may be not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
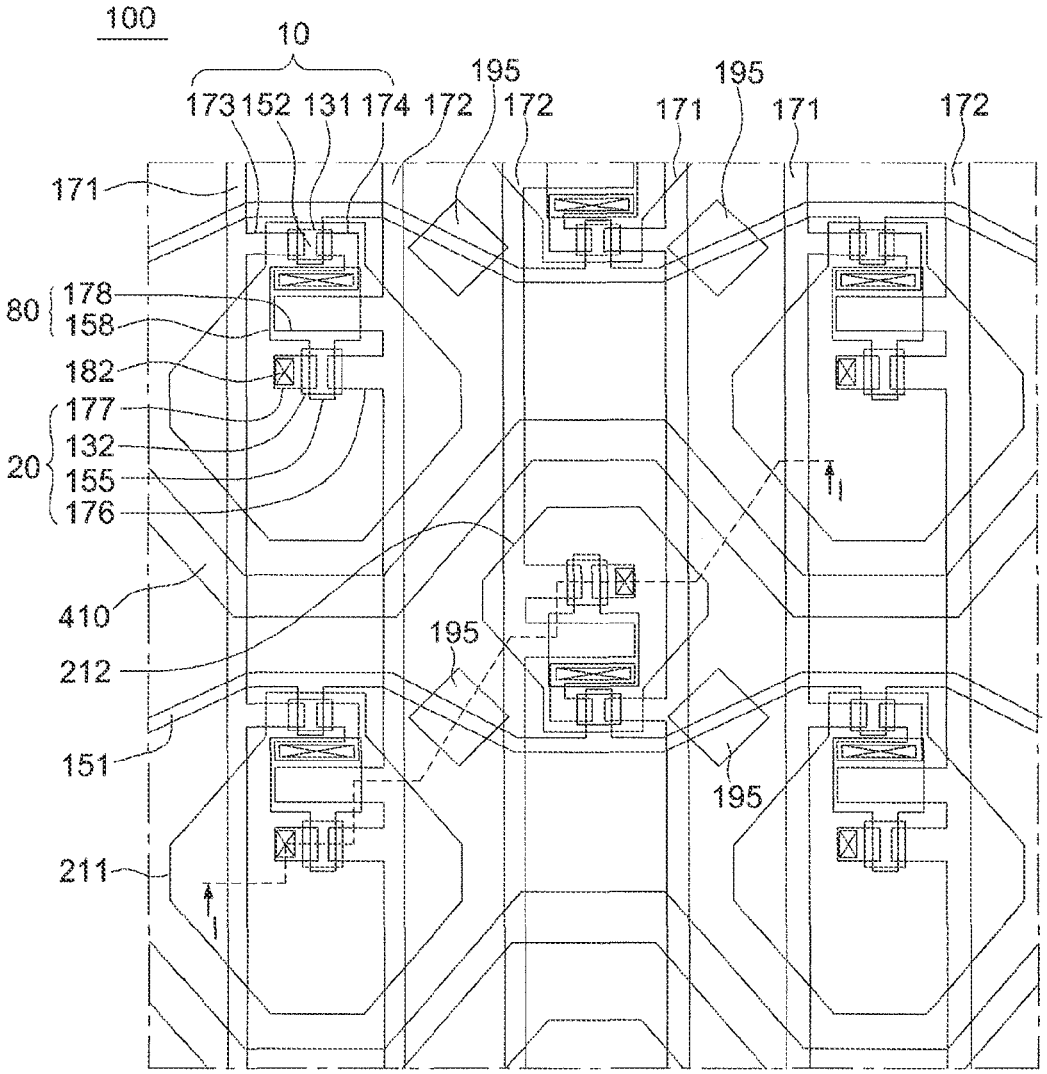
FIG. 1 illustrates a layout view showing an OLED display according to a first embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The accompanying drawings are selected to illustrate exemplary embodiments. In the drawings, respective elements and shapes may be simplified or exaggerated to better illustrate the exemplary embodiments, and other elements present in an actual product may be omitted from the drawings. Thus, the drawings are intended to facilitate the understanding of the exemplary embodiments. Like reference numerals refer to like elements throughout the specification.

Throughout the specification, when an element may be referred to as being "connected" to another element, the element may be "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

In addition, when a layer or element may be referred to as being "on" another layer or element, the layer or element may be directly on the other layer or element, or one or more intervening layers or elements may be interposed therebetween.

Hereinafter, a first embodiment will be described with reference to FIGS. 1 and 2.

Figure 2:
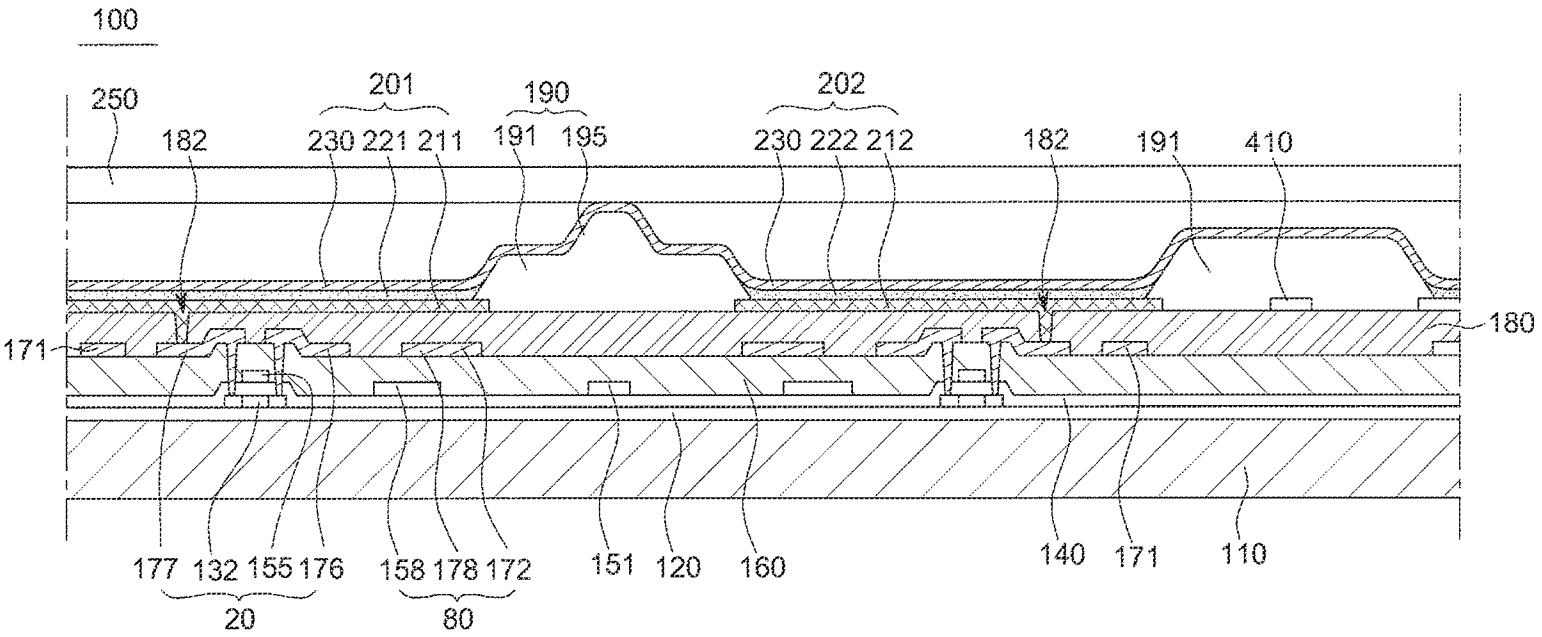
FIG. 2 illustrates a cross-sectional view taken along line I-I' of FIG. 1.

As illustrated in FIGS. 1 and 2, an OLED display 100 according to a first embodiment may have a plurality of pixels that include a switching thin film transistor (TFT) 10, a driving TFT 20, a capacitor 80 and OLEDs 201 and 202. Herein, the pixel is the smallest unit that displays an image, and the OLED display may display an image through the plurality of pixels.

Referring to FIG. 1, two TFTs and one capacitor may be included in one pixel; however, the first embodiment may be not limited thereto. Thus, the OLED display may include three or more TFTs and two or more capacitors in one pixel, or may be configured to have various structures by further including separate wires.

The OLED display 100 may include a gate line 151 on a substrate 110, and a data line 171 and a common power source line 172 that may be insulated from and intersect the gate line 151. A pixel area may be defined by the gate line 151, the data line 171, and the common power source line 172, but it may be not limited thereto. The pixel area may also be defined by a black matrix or a pixel defining layer.

The substrate 110 may be made of an insulating material including glass, quartz, ceramic, or plastic. However, the first embodiment may be not limited thereto. Therefore, the substrate 110 may also be made of a metal material such as stainless steel.

A buffer layer 120 may be disposed on the substrate 110. The buffer layer 120 may reduce or prevent penetration of undesirable elements and planarize a surface, and may include various materials in accordance therewith. For instance, the buffer layer 120 may include at least one of the following: a silicon nitride (SiNx) layer, a silicon oxide (SiO2) layer, and a silicon oxynitride (SiOxNy) layer. However, the buffer layer 120 may be omitted according to the kind of the substrate 110 and process conditions thereof.

A switching semiconductor layer 131 and a driving semiconductor layer 132 may be disposed on the buffer layer 120. The switching semiconductor layer 131 and the driving semiconductor layer 132 may be made of a polycrystalline silicon layer, an amorphous silicon layer, or an oxide semiconductor.

A gate insulating layer 140 made of silicon nitride (SiNx) or silicon oxide (SiO2) may be disposed on the switching semiconductor layer 131 and the driving semiconductor layer 132. A gate wire including a driving gate electrode 155 may be disposed on the gate insulating layer 140. The gate wire further may include a gate line 151, a first capacitor plate 158, and other wires. Further, a switching gate electrode 152 may be disposed to overlap at least a part of the switching semiconductor layer 131, and the driving gate electrode 155 may be disposed to overlap at least a part of the driving semiconductor layer 132.

An interlayer insulating layer 160 configured to cover the driving gate electrode 155 may be disposed on the gate insulating layer 140. The gate insulating layer 140 and the interlayer insulating layer 160 may have in common a via hole (through hole) exposing a source region and a drain region of the switching and driving semiconductor layers 131 and 132. The interlayer insulating layer 160 may be made of silicon nitride (SiNx) or silicon oxide (SiO2) in the same manner as the gate insulating layer 140.

A data wire may be disposed on the interlayer insulating layer 160, wherein the data wire includes a switching source electrode 173, a switching drain electrode 174, a driving source electrode 176, and a driving drain electrode 177. The data wire further may include the data line 171, the common power source line 172, a second capacitor plate 178, and other wires. Further, the switching source electrode 173, the switching drain electrode 174, the driving source electrode 176, and the driving drain electrode 177 may each be connected to the source region and the drain region of the switching semiconductor layer 131 and the driving semiconductor layer 132.

As described above, the switching TFT 10 may include the switching semiconductor layer 131, the switching gate electrode 152, the switching source electrode 173, and the switching drain electrode 174, and the driving TFT 20 may include the driving semiconductor layer 132, the driving gate electrode 155, the driving source electrode 176, and the driving drain electrode 177. The configuration of the TFTs 10 and 20 may be not limited to the above-described embodiment, and may vary based on many different configurations which are known to and can be easily carried out by those skilled in the art.

The capacitor 80 may include the first capacitor plate 158 and the second capacitor plate 178 with the gate insulating layer 140 interposed therebetween.

The switching TFT 10 may be used as a switching element configured to select a pixel for emitting light. The switching gate electrode 152 may be connected to the gate line 151. The switching source electrode 173 may be connected to the data line 171. The switching drain electrode 174 may be spaced apart from the switching source electrode 173 and may be connected to the first capacitor plate 158.

The driving TFT 20 may apply driving power to the pixel electrodes 211 and 212 so that the light emitting layers 221 and 222 of the OLEDs 201 and 202 in the selected pixel emit light. The driving gate electrode 155 may be connected to the first capacitor plate 158. The driving source electrode 176 and the second capacitor plate 178 may each be connected to the common power source line 172. The driving drain electrode 177 may be connected to the pixel electrodes 211 and 212 of the OLEDs 201 and 202 through a contact hole 182.

With the above-described structure, the switching TFT 10 may be driven by a gate voltage applied to the gate line 151 to transmit a data voltage applied to the data line 171 to the driving TFT 20. A voltage equivalent to a difference between a common voltage applied from the common power source line 172 to the driving TFT 20 and the data voltage transmitted from the switching TFT 10 may be stored in the capacitor 80, and a current corresponding to the voltage stored in the capacitor 80 may flow to the OLEDs 201 and 202 through the driving TFT 20, so that the OLEDs 201 and 202 may emit light.

A planarization layer 180 configured to cover the data wires 171, 172, 173, 174, 176, 177, and 178 may be disposed on the interlayer insulating layer 160. The planarization layer 180 may be configured to planarize a surface of the OLEDs 201 and 202 by eliminating or reducing steps so as to increase luminous efficiency of the OLEDs 201 and 202 that will be disposed on the planarization layer.

Further, the planarization layer 180 may have a contact hole 182 that may expose a part of the driving drain electrode 177.

The planarization layer 180 may be made of at least one of the following materials: polyacrylate resin, epoxy resin, phenolic resin, polyamide resin, polyimide resin, unsaturated polyesters resin, polyphenylenethers resin, polyphenylenesulfides resin, and benzocyclobutene (BCB).

The pixel electrodes 211 and 212 of the OLEDs 201 and 202 may be disposed on the planarization layer 180. The pixel electrodes 211 and 212 may be connected to the driving drain electrode 177 through the contact hole 182 of the planarization layer 180. The pixel electrodes 211 and 212 may be any one of the following types: a transmissive type, a translucent type, and a reflective type.

A transmissive electrode may be made of transparent conductive oxide (TCO) such as indium tin oxide (ITO), indium zinc oxide (IZO), zinc oxide (ZnO), or indium oxide (In2O3).

A translucent or reflective electrode may be made of a metal such as magnesium (Mg), silver (Ag), gold (Au), calcium (Ca), lithium (Li), chromium (Cr), aluminum (Al), and copper (Cu), or a metal alloy thereof. In this case, whether an electrode may be a reflective type or a translucent type may depend on the thickness of the electrode. Generally, the translucent electrode may have a thickness of about 200 nm or less, and the reflective electrode have a thickness of about 300 nm or more. As the thickness of the translucent electrode decreases, the transmittance of light and the resistance may increase. Conversely, as the thickness of the translucent electrode increases, the transmittance of light may decrease.

Further, the translucent and reflective electrodes may have a multilayer structure including a metal layer made of a metal or a metal alloy and a transparent conductive oxide layer laminated on the metal layer.

The OLED display 100 may be classified into the following types: a top emission type, a bottom emission type, and a dual emission type, depending on the materials used to form the pixel electrodes 211 and 212 and the common electrode 230. The OLED display 100 according to the first embodiment may be classified as a top emission type. Thus, the OLEDs 201 and 202 may emit light in the direction of the common electrode 230 to display an image.

In the case of the top emission OLED display, the pixel electrodes 211 and 212 may be a reflective electrode in order to increase emission efficiency of light generated in the OLEDs 201 and 202. An example of such a reflective electrode includes an electrode in which a transparent conductive oxide made of ITO may be laminated on a metal layer made of silver (Ag). In addition, an electrode having a triple-layered structure in which the silver (Ag) layer, the ITO layer, and the silver (Ag) layer is sequentially laminated, may be used.

According to the first embodiment, the OLED display 100 may include an auxiliary wire 410 spaced apart from the pixel electrodes 211 and 212 and disposed on the planarization layer 180.

The auxiliary wire 410 may be an initialization voltage wire, Vint, for example. The initialization voltage wire may supply an initialization voltage that initializes the driving TFT 20. The initialization voltage wire may be used for the OLEDs 201 and 202 to discharge electric charges or for the OLEDs 201 and 202 to have the same potential as each other after being driven. Although not illustrated, the OLEDs 201 and 202 and the auxiliary wire 410 may be connected by a thin film transistor. However, the auxiliary wire 410 according to the first embodiment may be not limited to the initialization voltage wire Vint, and may be other wires. The auxiliary wire 410 may be a signal wire (line) or may be a bypass wire (line) allowing a leakage current to flow.

The auxiliary wire 410 may be disposed on the same layer as the pixel electrodes 211 and 212. The auxiliary wire 410 may be manufactured by the same manufacturing process, may be made of the same material, and may have the same laminated structure as the pixel electrodes 211 and 212. In other words, the pixel electrodes 211 and 212 and the auxiliary wire 410 may be formed together at a time. Therefore, the auxiliary wire 410 may also include at least one metal layer and at least one transparent conductive oxide layer. That is, the auxiliary wire 410 may include the metal layer on the planarization layer 180 on the substrate 110 and the transparent conductive oxide layer on the metal layer.

A pixel defining layer 190 may be disposed on the planarization layer 180. The pixel defining layer 190 may include a pixel defining part 191 configured to define a pixel area by exposing the pixel electrodes 211 and 212, and a plurality of spacers 195 protruding from an upper portion of the pixel defining part 191, namely in the opposite direction of the planarization layer 180. In this case, the pixel electrodes 211 and 212 may be disposed to correspond to an opening that is the pixel area of the pixel defining part 191.

In detail, the pixel defining layer 190 may be made of polyacrylate resin, polyimide resin, and the like.

The pixel defining part 191 and the spacer 195 of the pixel defining layer 190 may be integrated with each other using a photosensitive material through phothlithography. In other words, the pixel defining part 191 and the spacer 195 may be made of the same material. In detail, the pixel defining part 191 and the spacer 195 may be formed together by adjusting exposure dose by a halftone exposure process. However, the first embodiment is not limited thereto. Therefore, the pixel defining part 191 and the spacer 195 may be formed sequentially or separately, and each may be made of different materials.

The spacer 195 may be disposed on a space between the pixel electrodes 211 and 212, and may have any one of the following shapes: a truncated pyramid, a prism, a truncated cone, a cylinder, a hemisphere, and a hemispheroid.

According to the first embodiment, the pixel electrodes 211 and 212 may be a reflective electrode, and thus the auxiliary wire 410 may also be a reflective electrode. Therefore, the auxiliary wire 410 may reflect ambient light.

The reflection of ambient light from the auxiliary wire 410 will be described below with reference to FIG. 3.

The pixel defining layer 190 may also be disposed on the auxiliary wire 410 as well as on the planarization layer 180, except for the pixel area where the pixel electrodes 211 and 212 are placed. In the case where the pixel defining layer 190 on the auxiliary wire 410 is flat, ambient light L1 incident on the auxiliary wire 410 may be reflected as typical reflected light L2. Therefore, in the case where a polarizer for blocking ambient light is disposed on the upper portion of the pixel defining layer 190, the ambient light L1 may be blocked by the polarizer.

Figure 3:
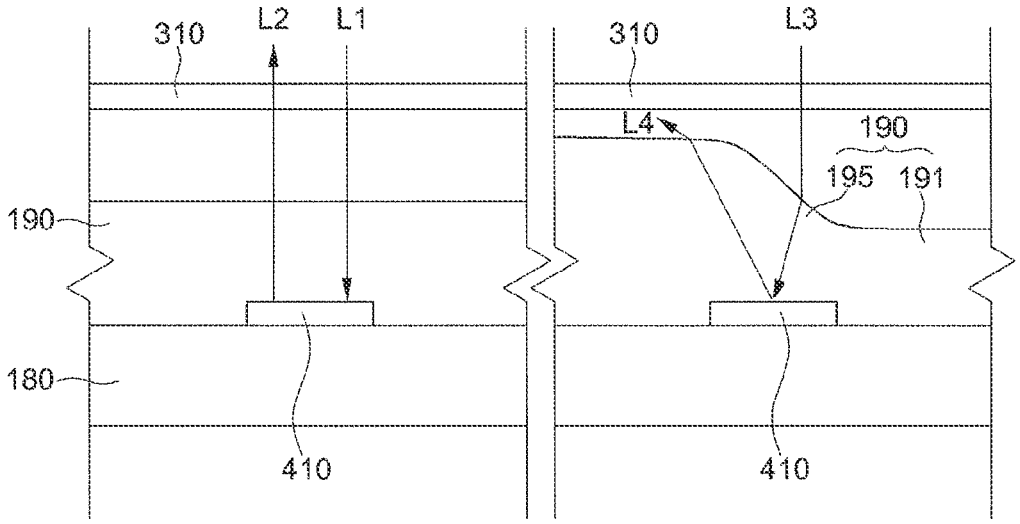
FIG. 3 illustrates a mimetic diagram of a path of ambient light incident on an auxiliary wire.

On the other hand, as illustrated in the right side of FIG. 3, if there are an inclined surface formed by the spacer 195 on the upper portion of the auxiliary wire 410, even when ambient light L3 may be incident perpendicularly, the incident light L3 may be refracted when passing through the inclined surface, and thus light L4 which has been reflected from the auxiliary wire 410 may take a different path than the incident light L3. In this case, even though a polarizer 310 is disposed, destructive interference between the indent light L3 and the reflected light L4 may not or may not substantially occur.

Further, the polarization state of the ambient light L3 may be changed after passing through the inclined surface. In detail, in the case where the polarizer 310 having circular polarization properties (circular polarizer) is disposed on the upper portion of the pixel defining layer 190, the ambient light L3 which has reached the auxiliary wire 410 by passing through the polarizer 310 and the inclined surface of the pixel defining layer 190 may be reflected in an elliptical polarization state. Destructive interference between the elliptically polarized reflected light L4 and the circularly polarized incident light L3 may not occur or may not or may not substantially occur.

Thus, in the case where the spacer 195 is disposed on the reflective auxiliary wire 410, reflected light which is not subject to destructive interference may increases so that visibility of the OLED display 100 may be lowered.

The patterned spacer 195 is illustrated in FIG. 2, but a pixel defining layer-forming material may be reflowed in a heat curing process after the pixel defining layer 190 is formed so that the shape of the spacer 195 of the pixel defining layer 190 may be distorted. Accordingly, changes in a path of the ambient light and polarization may become larger on the inclined surface of the spacer 195.

Thus, in order to reduce or prevent ambient light incident on the inclined surface of the spacer 195 from being reflected from the auxiliary wire 410, the spacer 195 of the pixel defining layer 190 according to the first embodiment may not overlap the auxiliary wire 410. In other words, the spacer 195 may not be disposed on the upper portion of the auxiliary wire 410.

The light emitting layers 221 and 222 may be disposed on the pixel electrodes 211 and 212 in the opening of the pixel defining part 191. The common electrode 230 may be disposed on the pixel defining layer 190 and the light emitting layers 221 and 222.

The light emitting layers 221 and 222 may include a low molecular weight organic material or a high molecular weight organic material. At least one of a hole injection layer HIL and a hole transporting layer HTL may be further disposed between the pixel electrodes 211 and 212 and the light emitting layers 221 and 222. At least one of an electron transporting layer ETL and an electron injection layer EIL may be further disposed between the light emitting layers 221 and 222 and the common electrode 230.

The common electrode 230 may be made of a translucent layer. The translucent layer used as the common electrode 230 may be made of at least one metal including magnesium (Mg), silver (Ag), calcium (Ca), lithium (Li), chromium (Cr), aluminum (Al) and copper (Cu). The common electrode 230 may have a multilayer structure including a metal layer including at least one of magnesium (Mg), silver (Ag), calcium (Ca), lithium (Li), chromium (Cr), aluminum (Al) and copper (Cu), and a transparent conductive oxide (TCO) layer laminated on the metal layer.

As described above, the OLEDs 201 and 202 may include the pixel electrodes 211 and 212, the light emitting layers 221 and 222 on the pixel electrodes 211 and 212, and the common electrode 230 on the light emitting layers 221 and 222. Herein, the pixel electrodes 211 and 212 may serve as an anode which may be a hole injection electrode, and the common electrode 230 may serve as a cathode which may be an electron injection electrode. However, the first embodiment is not limited thereto, and thus, the pixel electrodes 211 and 212 may be cathodes, and the common electrode 230 may be an anode according to a driving method of the OLED display 100.

The OLED display 100 as illustrated in FIG. 2 may further includes the pixel defining layer 190 and a sealing member 250.

The sealing member 250 may be bonded to the substrate 110 so as to seal the OLEDs 201 and 202 interposed therebetween. The sealing member 250 may seal and cover the TFTs 10 and 20 and the OLEDs 201 and 202 on the substrate 110 for protection. An insulating substrate made of glass or plastic may be used for the sealing member 250.

The spacer 195 of the pixel defining layer 190 may serve to maintain a space between the substrate 110 and the sealing member 250.

A polarizer may be disposed on the sealing member 250.

The following comparison is provided in order to highlight characteristics of one or more embodiments, but it will be understood that the example and comparative example are not to be construed as limiting the scope of the embodiments, nor is the comparative example to be construed as being outside the scope of the embodiments. Further, it will be understood that the embodiments are not limited to the particular details described in the examples and comparative example.

Figure 4A:
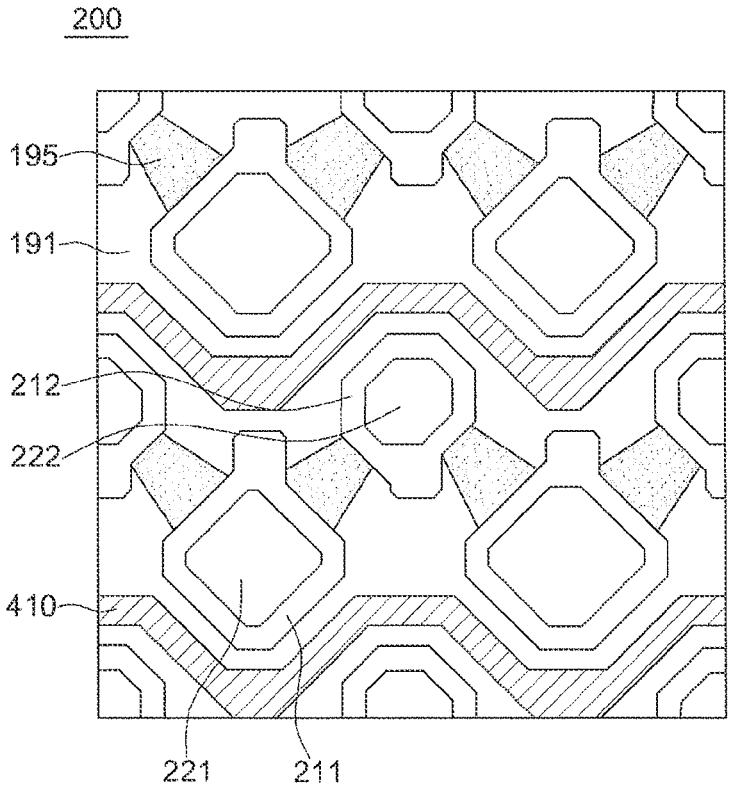
FIG. 4A illustrates a plan view showing an OLED display according to a second embodiment.
Figure 4B:
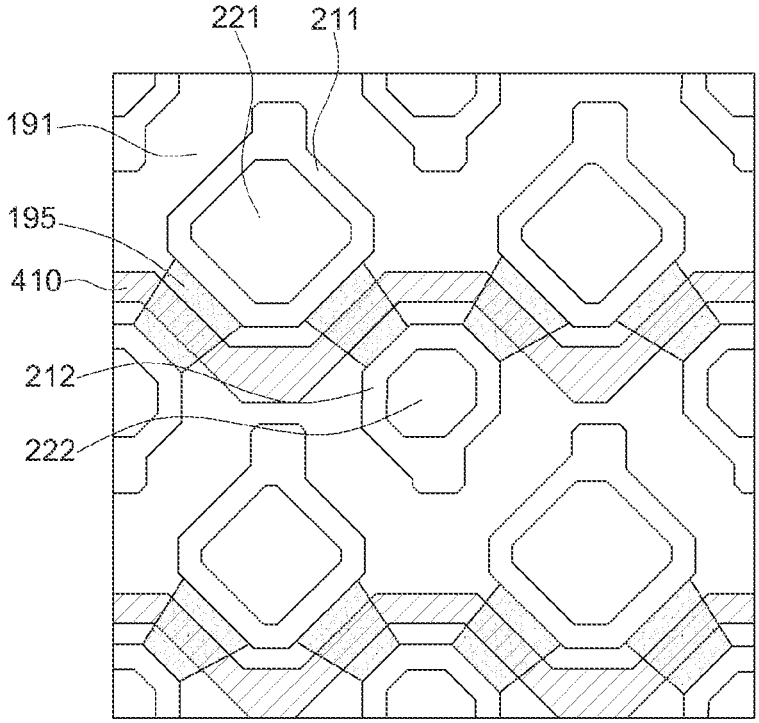
FIG. 4B illustrates a plan view showing an OLED display according to a comparative example.

FIGS. 4A and 4B illustrate layout views showing an OLED display for comparison of reflectivities depending on the position of the spacer 195. FIGS. 4A and 4B illustrate only the pixel electrodes 211 and 212, light emitting layers 221 and 222, the spacer 195 and the auxiliary wire 410. In detail, FIG. 4A is a plan view showing an OLED display 200 according to a second embodiment, and FIG. 4B is a plan view showing an OLED display according to a comparative example.

All elements of the OLED display 200 of FIG. 4A and the OLED display of FIG. 4B may be the same except for the position of the spacer 195. That is, the spacer 195 of FIG. 4A does not overlap the auxiliary wire 410, and the spacer 195 of FIG. 4B overlaps the auxiliary wire 410.

Figure 5:
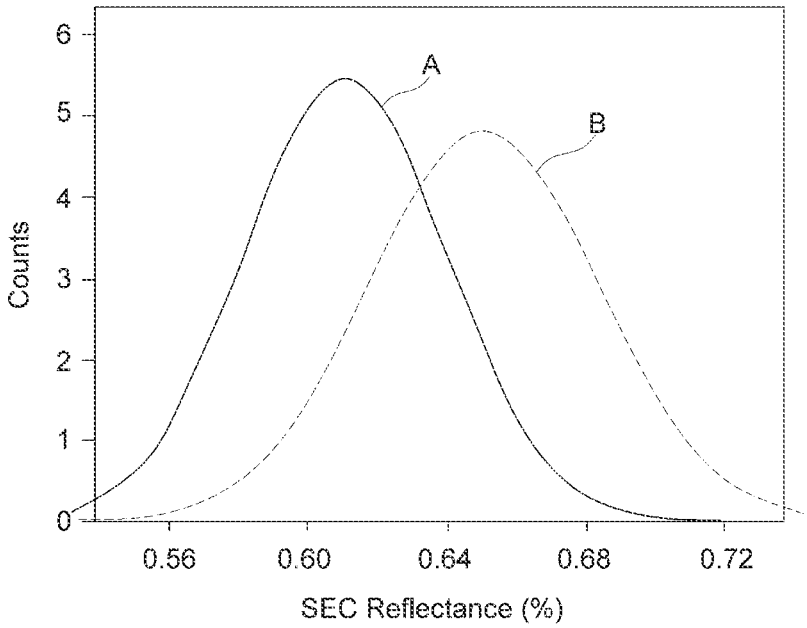
FIG. 5 illustrates a graph comparing reflectivities of the OLED displays of FIGS. 4A and 4B.

FIG. 5 illustrates a graph comparing reflectivities between the OLED displays of FIGS. 4A and 4B. The reflectance of specular component excluded (SCE) may be measured. SCE reflectance may be obtained by only measuring diffuse reflection excluding specular reflection. When humans perceive an object, the diffuse reflection may only be perceived except for the specular reflection, and thus the SCE reflectance may be measured.

Distributions of reflectance values are shown in the graph of FIG. 5 based on measurement of reflectance at a plurality of times using the OLED displays of FIGS. 4A and 4B. Referring to FIG. 5, the OLED display A of FIG. 4A has an average reflectance of 0.61%, and the OLED display B of FIG. 4B has an average reflectance of 0.65%. Thus, compared to the OLED display of the comparative example B, the OLED display 200 according to the second embodiment A has reflectance reduced by 6.15%.

Figure 6:
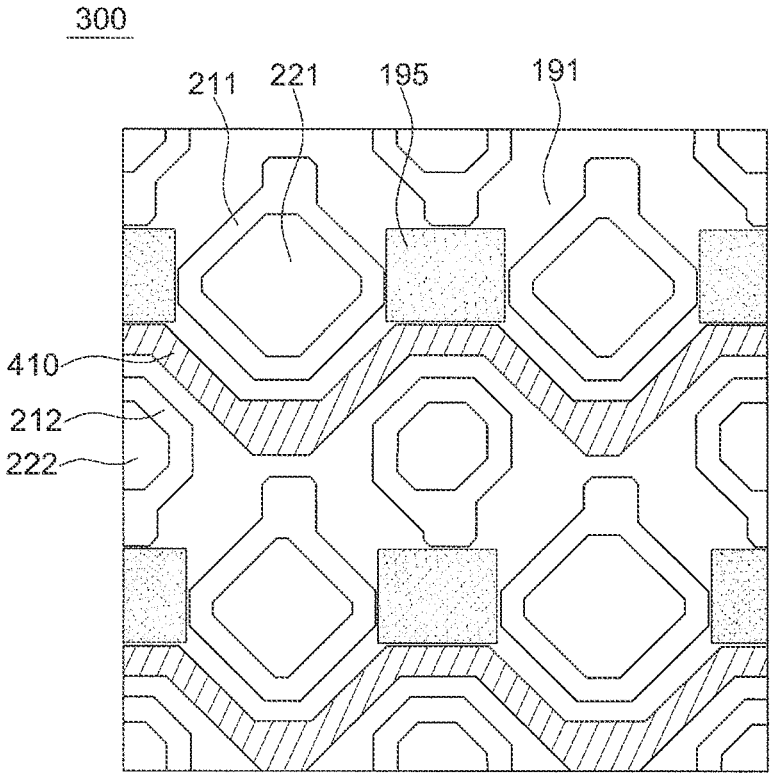
FIG. 6 illustrates a layout view showing an OLED display according to a third embodiment.

FIG. 6 illustrates a layout view showing an OLED display 300 according to a third embodiment. The spacer 195 of the OLED display 300 of FIG. 6 does not overlap the auxiliary wire 410 unlike the OLED displays 100 and 200 of FIG. 4B.

Hereinafter, a method of manufacturing the OLED display 100 according to the first embodiment will be described with reference to FIGS. 7A to 7D.

Figure 7A:
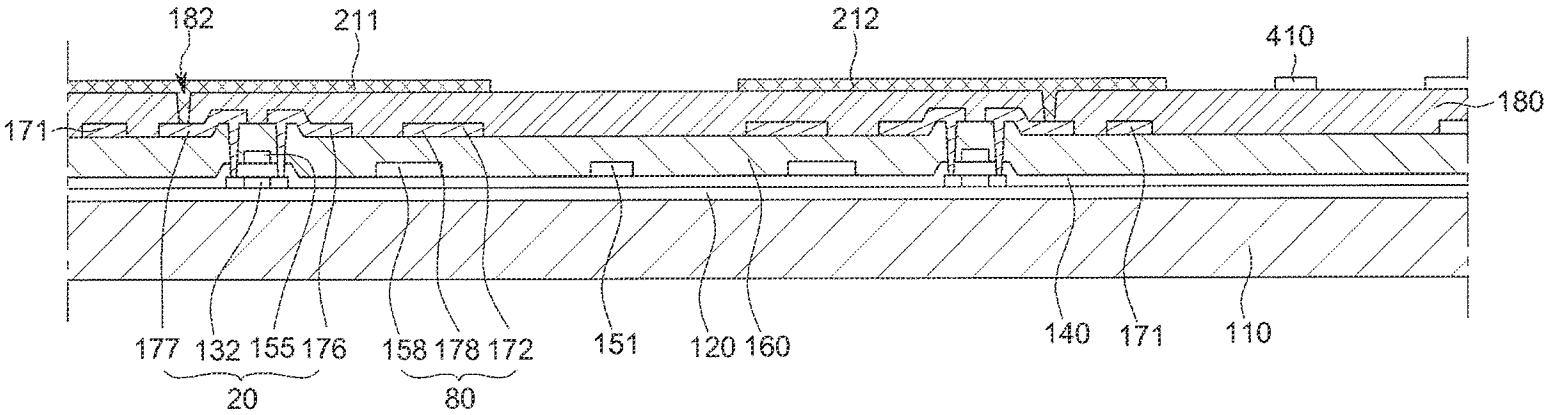
FIGS. 7A to 7D illustrate cross-sectional views sequentially showing a manufacturing process of the OLED display of FIG. 1.

As illustrated in FIG. 7A, the TFT 20, the capacitor 80, and the pixel electrodes 211 and 212 connected to the drain electrode 177 of the TFT 20 may be formed on the substrate 110. In this case, the auxiliary wire 410 may be disposed between the pixel electrodes 211 and 212. The auxiliary wire 410 may be disposed on the same layer as the pixel electrodes 211 and 212. That is, the pixel electrodes 211 and 212 and the auxiliary wire 410 may be disposed on the planarization layer 180.

A forming of the pixel electrodes 211 and 212 and the auxiliary wire 410 may include forming a conductive material layer including at least one metal layer and at least one transparent conductive oxide layer on the planarization layer 180 on the substrate 110, and patterning the conductive material layer. The patterning of the conductive material layer may be performed by a photolithography process.

Figure 7B:
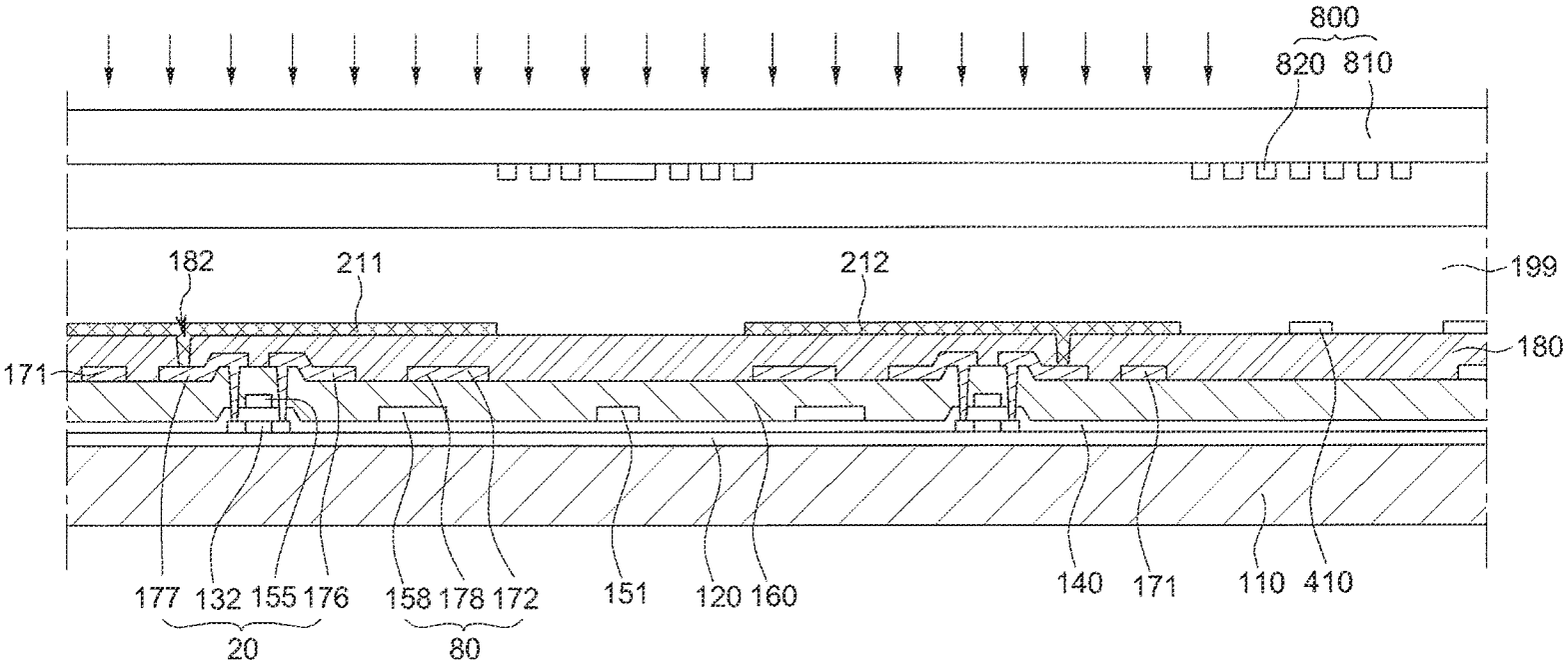

Next, a photosensitive material may be coated on the pixel electrodes 211 and 212 and the auxiliary wire 410 to form a photosensitive material layer 199, and the photolithography process may he performed using a mask 800 (FIG. 7B).

The mask 800 may include a mask substrate 810 and a light shielding pattern 820 on the mask substrate 810. The photolithography process may include a halftone exposure in which a slit patterned mask 800 may be used. An exposed part in the photosensitive material layer 199 may be removed from the photosensitive material layer 199 in a developing process, and a non-exposed part may remain after the developing process. In this case, the exposed part may remain and the non-exposed part may be removed depending on the kind of the photosensitive material layer 199.

In this case, the light shielding pattern 820 may be configured such that the spacer 195 may not be formed on the auxiliary wire 410 but may be formed on a region where the auxiliary wire 410 is not disposed. The pixel defining part 195 may be disposed only on the auxiliary wire 410.

Figure 7C:
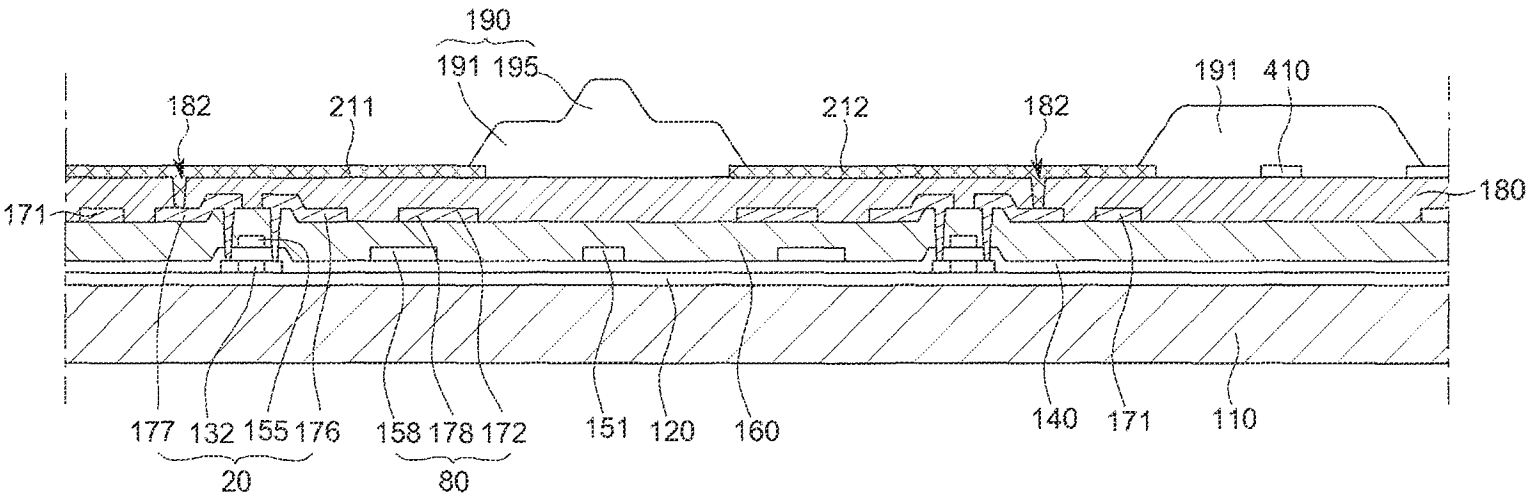

Next, as illustrated in FIG. 7C, the pixel defining layer 190 including the pixel defining part 191 and the spacer 195 may be formed through the developing process. Further, a curing process may be performed after the developing process so that the pixel defining layer 190 becomes stable. For the curing, heat may be applied to the pixel defining layer 190, or light may be irradiated thereto in some cases. In the heat curing process, a material forming the pixel defining layer 190 may partially flow down so that the spacer 195 may have a gradual slope.

Figure 7D:
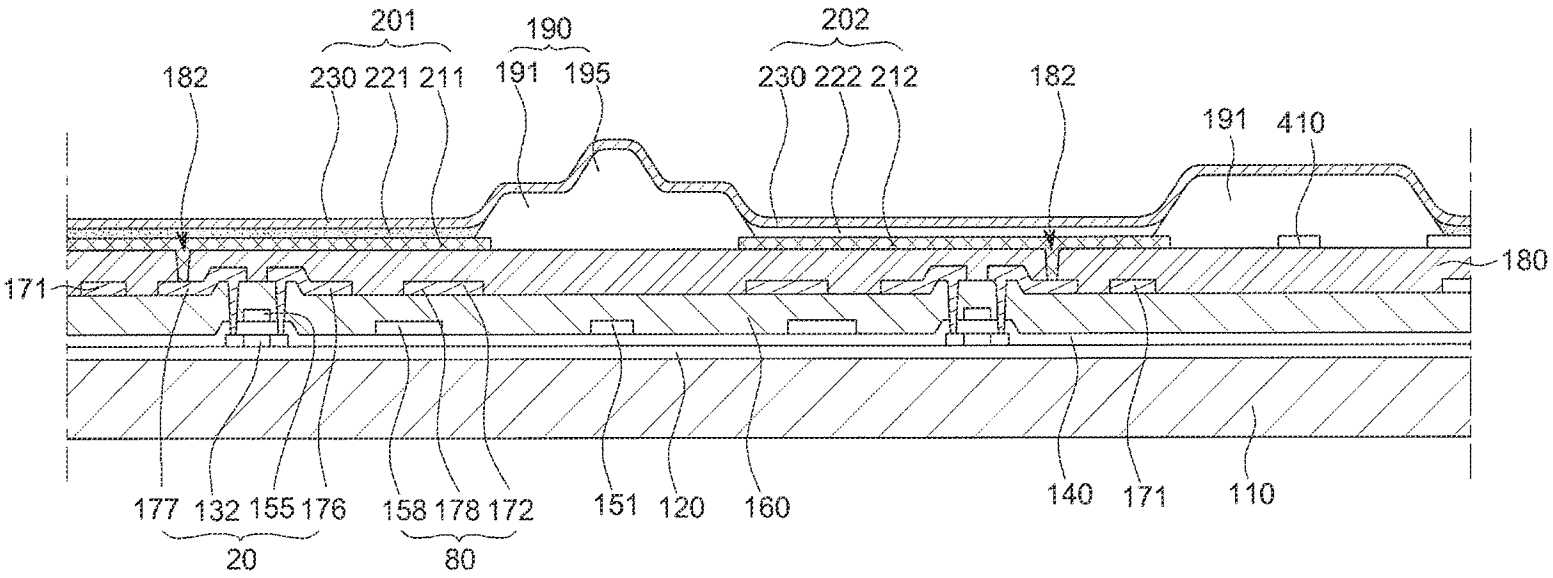

Next, as illustrated in FIG. 7D, the light emitting layers 221 and 222 may be formed on the pixel electrodes 211 and 212 exposed through the opening of the pixel defining part 191, and the common electrode 230 may be formed on the light emitting layers 221 and 222 and the pixel defining layer 190.

Herein, the common electrode 230 may be a translucent layer including at least one metal of magnesium (Mg), silver (Ag), calcium (Ca), lithium (Li), chromium (Cr), and aluminum (Al).

Next, the sealing member 250 may be disposed on the common electrode 230 to form the OLED display 100 as illustrated in FIG. 2. In this case, the spacer 195 of the pixel defining layer 190 may maintain a space between the substrate 110 and the sealing member 250.

According to the above described method, an OLED display 100 in which visibility may be improved by suppressing reflection of ambient light may be manufactured.

By way of summation and review, electrodes and wires disposed on an OLED display may reflect ambient light. Due to the ambient light reflection, the OLED display may have difficulty in accurately displaying black color and may have a low contrast, thereby exhibiting poor display characteristics.

In contrast, in the embodiments disclosed herein, an OLED display is provided with improved visibility by limiting ambient light reflection. In particular, according to exemplary embodiments, an OLED display may include a spacer provided in a pixel defining layer and an auxiliary wire on the same layer as a pixel electrode, and the auxiliary wire may be disposed not to overlap the spacer. Accordingly, ambient light reflection occurring in the auxiliary wire may be reduced so that visibility of the OLED display may be improved.

Further, exemplary embodiments are directed to a method of manufacturing the OLED display.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

[1. An organic light emitting diode display, comprising:

a substrate;

a pixel defining layer on the substrate, the pixel defining layer defining pixel areas;

a pixel electrode on each pixel area;

a light emitting layer on the pixel electrode;

a common electrode on the light emitting layer; and an auxiliary wire spaced apart from the pixel electrode and on a same layer as the pixel electrode, wherein:

the pixel defining layer includes a pixel defining part defining the pixel areas and a plurality of spacers protruding from the pixel defining part, the auxiliary wire does not overlap the spacer, and the plurality of spacers are discontinuously arranged in a region between the pixel areas.]

[2. The organic light emitting diode display as claimed in claim 1, wherein the auxiliary wire is an initialization voltage wire.]

[3. The organic light emitting diode display as claimed in claim 1, wherein the pixel electrode and the auxiliary wire are made of a same material.]

[4. The organic light emitting diode display as claimed in claim 3, wherein the auxiliary wire comprises at least one metal layer and at least one transparent conductive oxide layer.]

[5. The organic light emitting diode display as claimed in claim 3, wherein the auxiliary wire comprises a metal layer on the substrate and a transparent conductive oxide layer on the metal layer.]

[6. The organic light emitting diode display as claimed in claim 1, further comprising a sealing member facing the substrate, wherein:

the pixel defining layer is between the sealing member and the substrate, and the spacer of the pixel defining layer maintains a space between the substrate and the sealing member.]

[7. The organic light emitting diode display as claimed in claim 1, wherein the pixel defining part and the spacer are made of a same material.]

[8. The organic light emitting diode display as claimed in claim 1, wherein the spacer has any one of the following shapes: a truncated pyramid, a prism, a truncated cone, a cylinder, a hemisphere, and a hemispheroid.]

[9. The organic light emitting diode display as claimed in claim 1, wherein the auxiliary wire overlaps the pixel defining part.]

[10. A method of manufacturing an organic light emitting diode display, the method comprising:

forming a pixel electrode and an auxiliary wire on a substrate;

forming a photosensitive material layer on the pixel electrode and the auxiliary wire;

forming a pixel defining layer including pixel areas that expose a part of the pixel electrode by patterning the photosensitive material layer;

forming a light emitting layer on the pixel electrode; and forming a common electrode on the light emitting layer, wherein:

the pixel defining layer includes a pixel defining part defining the pixel areas and a plurality of spacers protruding from the pixel defining part, the auxiliary wire does not overlap the spacer, and the plurality of spacers are discontinuously arranged in a region between the pixel areas.]

[11. The method as claimed in claim 10, wherein forming the pixel defining layer includes using a mask including a light shielding pattern.]

[12. The method as claimed in claim 10, wherein forming the pixel defining layer includes performing a halftone exposure.]

[13. The method as claimed in claim 10, further comprising arranging a sealing member to face the substrate, wherein:

the pixel defining layer is formed between the sealing member and the substrate, and the spacer of the pixel defining layer maintains a space between the substrate and the sealing member.]

[14. The method as claimed in claim 10, wherein the spacer has any one of the following shapes: a truncated pyramid, a prism, a truncated cone, a cylinder, a hemisphere, and a hemispheroid.]

[15. The method as claimed in claim 10, wherein the forming of the pixel electrode and the auxiliary wire comprises:

forming a conductive material layer comprising at least one metal layer and at least one transparent conductive oxide layer on the substrate; and patterning the conductive material layer.]

[16. The method as claimed in claim 10, wherein the auxiliary wire overlaps the pixel defining part.]

[17. The organic light emitting diode display as claimed in claim 6, wherein the common electrode is between the spacer and the sealing member.]

[18. The organic light emitting diode display as claimed in claim 1, wherein the common electrode is on the spacer.]

[19. The method as claimed in claim 10, wherein the common electrode is formed on the spacer.]

*20. An organic light emitting diode display, comprising:*

*a substrate;*

*a plurality of pixel electrodes on the substrate;*

*a pixel defining layer on the substrate;*

*a light emitting layer on a pixel electrode from among the plurality of pixel electrodes;*

*a common electrode on the light emitting layer; and*

*an auxiliary wire spaced apart from the pixel electrode and on a same layer as the pixel electrode,*

*wherein:*

*the pixel defining layer includes a pixel defining part and a plurality of spacers protruding from the pixel defining part,*

*the auxiliary wire is spaced apart from the plurality of spacers in a plan view,*

*the plurality of spacers are discontinuously arranged on the pixel defining part between some of the plurality of pixel electrodes in a plan view, and*

*the auxiliary wire extends between some adjacent pixel electrodes from among the plurality of pixel electrodes.*

*21. The organic light emitting diode display as claimed in claim 20, wherein the auxiliary wire is an initialization voltage wire.*

*22. The organic light emitting diode display as claimed in claim 20, wherein the pixel electrode and the auxiliary wire are made of a same material.*

*23. The organic light emitting diode display as claimed in claim 22, wherein the auxiliary wire comprises at least one metal layer and at least one transparent conductive oxide layer.*

*24. The organic light emitting diode display as claimed in claim 22, wherein the auxiliary wire comprises a metal layer on the substrate and a transparent conductive oxide layer on the metal layer.*

*25. The organic light emitting diode display as claimed in claim 20, further comprising a sealing member facing the substrate,*

*wherein:*

*the pixel defining layer is between the sealing member and the substrate, and*

*the plurality of spacers of the pixel defining layer maintains a space between the substrate and the sealing member.*

*26. The organic light emitting diode display as claimed in claim 25, wherein the common electrode is between the plurality of spacers and the sealing member.*

*27. The organic light emitting diode display as claimed in claim 20, wherein the pixel defining part and the plurality of spacers are made of a same material.*

*28. The organic light emitting diode display as claimed in claim 20, wherein the plurality of spacers have any one of the following shapes: a truncated pyramid, a prism, a truncated cone, a cylinder, a hemisphere, and a hemispheroid.*

*29. The organic light emitting diode display as claimed in claim 20, wherein the auxiliary wire overlaps the pixel defining part.*

*30. The organic light emitting diode display as claimed in claim 20, wherein the common electrode is on the plurality of spacers.*

*31. The organic light emitting diode display as claimed in claim 20, wherein the plurality of spacers are made of a same material as the pixel defining layer.*

*32. The organic light emitting diode display as claimed in claim 20,*

*wherein the auxiliary wire comprises a first portion, a second portion and a third portion connected to the first portion and the second portion, and*

*wherein the first portion and the second portion extend in a first direction, and the third portion extends in a second direction different from the first direction.*

*33. The organic light emitting diode display as claimed in claim 32,*

*wherein the pixel electrodes comprise a first pixel electrode and a second pixel electrode having a different size from the first pixel electrode, and*

*wherein the third portion extends between the first pixel electrode and the second pixel electrode.*

*34. The organic light emitting diode display as claimed in claim 33, wherein at least one of the first pixel electrode or the second pixel electrode has substantially a diamond shape in a plan view.*

*35. The organic light emitting diode display as claimed in claim 20, wherein the spacers are disposed between adjacent pixel electrodes having different sizes from each other.*

*36. The organic light emitting diode display as claimed in claim 20, further comprising other auxiliary wire disposed adjacent to the auxiliary wire, wherein pixel electrodes having different sizes from each other from among the plurality of pixel electrodes are disposed between the auxiliary wire and the other auxiliary wire.*

*37. A method of manufacturing an organic light emitting diode display, the method comprising:*

*forming a plurality of pixel electrodes and an auxiliary wire on a substrate;*

*forming a photosensitive material layer on the plurality of pixel electrodes and the auxiliary wire;*

*forming a pixel defining layer including a pixel area that exposes a part of a pixel electrode from among the plurality of pixel electrodes by patterning the photosensitive material layer;*

*forming a light emitting layer on the pixel electrode; and*

*forming a common electrode on the light emitting layer, wherein:*

*the pixel defining layer includes a pixel defining part defining pixel areas and a plurality of spacers protruding from the pixel defining part,*

*the auxiliary wire is spaced apart from the plurality of spacers in a plan view,*

*the plurality of spacers are discontinuously arranged in a region between the pixel areas, and*

*at least a portion of the auxiliary wire is disposed between some adjacent pixel electrodes from among the plurality of pixel electrodes.*

*38. The method as claimed in claim 37, wherein forming the pixel defining layer includes using a mask including a light shielding pattern.*

*39. The method as claimed in claim 37, wherein forming the pixel defining layer includes performing a halftone exposure.*

*40. The method as claimed in claim 37, further comprising arranging a sealing member to face the substrate, wherein:*

*the pixel defining layer is formed between the sealing member and the substrate, and*

*the plurality of spacers of the pixel defining layer maintains a space between the substrate and the sealing member.*

*41. The method as claimed in claim 37, wherein the plurality of spacers have any one of the following shapes: a truncated pyramid, a prism, a truncated cone, a cylinder, a hemisphere, and a hemispheroid.*

*42. The method as claimed in claim 37, wherein the forming of the pixel electrode and the auxiliary wire comprises:*

*forming a conductive material layer comprising at least one metal layer and at least one transparent conductive oxide layer on the substrate; and*

*patterning the conductive material layer.*

*43. The method as claimed in claim 37, wherein the auxiliary wire overlaps the pixel defining part.*

*44. The method as claimed in claim 37, wherein the common electrode is formed on the plurality of spacers.*

*45. An organic light emitting diode display, comprising:*

*a substrate;*

*a plurality of thin film transistors on the substrate;*

*an insulating layer on the thin film transistors;*

*a plurality of pixel electrodes on the insulating layer;*

*an auxiliary wire spaced apart from the pixel electrodes on the insulating layer;*

*a pixel defining layer on the pixel electrodes, the pixel defining layer defining pixel areas;*

*a plurality of spacers discontinuously arranged in a region between the pixel areas;*

*light emitting layers on the pixel electrodes; and*

*a common electrode on the light emitting layers,*

*wherein the auxiliary wire is serpentine and extends between the pixel electrodes,*

*wherein the plurality of pixel electrodes is comprised of at least two kinds of pixel electrodes in size, and*

*wherein the auxiliary wire is spaced apart from the spacers in a plan view.*

*46. The organic light emitting diode display as claimed in claim 45, wherein the auxiliary wire is an initialization voltage wire.*

*47. The organic light emitting diode display as claimed in claim 45, wherein the auxiliary wire is disposed on a same layer as the pixel electrodes.*

*48. The organic light emitting diode display as claimed in claim 47, wherein the auxiliary wire comprises at least one metal layer and at least one transparent conductive oxide layer.*

*49. The organic light emitting diode display as claimed in claim 47, wherein the auxiliary wire comprises a metal layer on the substrate and a transparent conductive oxide layer on the metal layer.*

*50. The organic light emitting diode display as claimed in claim 47, wherein the auxiliary wire is an initialization voltage wire.*

*51. The organic light emitting diode display as claimed in claim 50, wherein the auxiliary wire is made of a same material as the pixel electrodes.*

*52. The organic light emitting diode display as claimed in claim 51, wherein the auxiliary wire comprises at least one metal layer and at least one transparent conductive oxide layer.*

*53. The organic light emitting diode display as claimed in claim 52, wherein the auxiliary wire comprises a metal layer on the substrate and a transparent conductive oxide layer on the metal layer.*

*54. The organic light emitting diode display as claimed in claim 45, further comprising a sealing member facing the substrate,*

*wherein:*

*the pixel defining layer is between the sealing member and the substrate, and*

*the spacers maintain a space between the substrate and the sealing member.*

*55. The organic light emitting diode display as claimed in claim 45, wherein the spacers are made of a same material as the pixel defining layer.*

*56. The organic light emitting diode display as claimed in claim 45, wherein the spacers have any one of the following shapes: a truncated pyramid, a prism, a truncated cone, a cylinder, a hemisphere, and a hemispheroid.*

*57. The organic light emitting diode display as claimed in claim 45, wherein the auxiliary wire has a zigzag pattern.*

*58. The organic light emitting diode display as claimed in claim 45, wherein the auxiliary wire is between the substrate and the pixel defining layer.*

*59. The organic light emitting diode display as claimed in claim 45, wherein the auxiliary wire is disposed between the substrate and the pixel defining layer in a vertical direction.*

*60. The organic light emitting diode display as claimed in claim 45, wherein the common electrode is disposed on the pixel defining layer and the spacers.*

*61. The organic light emitting diode display as claimed in claim 45, wherein the two kinds of pixel electrodes have different shapes from each other.*

*62. The organic light emitting diode display as claimed in claim 45, wherein the spacers protrude from the pixel defining layer.*

*63. The organic light emitting diode display as claimed in claim 45, wherein the auxiliary wire is spaced apart from the common electrode.*

* * * * *